United States Patent [19]
Pezzani

[11] Patent Number: 5,631,181
[45] Date of Patent: May 20, 1997

[54] METHOD OF MAKING A MONOLITHIC DIODE ARRAY

[75] Inventor: Robert Pezzani, Vouvray, France

[73] Assignee: SGS-Thomson Microelectronics S.A., Saint Genis Pouilly, France

[21] Appl. No.: 479,953

[22] Filed: Jun. 7, 1995

Related U.S. Application Data

[62] Division of Ser. No. 216,585, Mar. 22, 1994.

[30] Foreign Application Priority Data

Apr. 13, 1993 [FR] France .................... 93 04586

[51] Int. Cl.$^6$ .................... H01L 21/70; H01L 27/00; H01L 21/60; H01L 23/48
[52] U.S. Cl. .................... 438/106; 438/128; 438/621
[58] Field of Search .................... 437/904, 182, 437/205, 206, 51; 257/784

[56] References Cited

U.S. PATENT DOCUMENTS

| | | | |
|---|---|---|---|
| 3,435,514 | 4/1969 | Dean | 257/784 |
| 3,913,216 | 10/1975 | Ballonoff | 437/904 |
| 5,278,101 | 1/1994 | Ikenoue | 437/206 |

FOREIGN PATENT DOCUMENTS 0318404  5/1989  European Pat. Off. ........ H01L 27/08

OTHER PUBLICATIONS

French Search Report from French Patent Application 93 04586, filed Apr. 13, 1993.

*Primary Examiner*—Mary Wilczewski
*Assistant Examiner*—Brian K. Dutton
*Attorney, Agent, or Firm*—David M. Driscoll; James H. Morris; John N. Anastasi

[57] ABSTRACT

A semiconductor component is formed in a semiconductor wafer, of a first conductivity type. The semiconductor component includes a plurality of first regions, of a second conductivity type, in a top surface of the wafer and coated with a first metallization layer. The semiconductor component further includes a second region, of the second conductivity type, and a third region, of the first conductivity type, each formed in the top surface of the wafer. A second metallization layer coats the second and third regions. A fourth region, of the first conductivity type, is formed in a bottom surface of the semiconductor wafer and opposes the first and second regions. A fifth region, of the second conductivity type, is also formed in the bottom surface and opposes the third region. A rear surface metallization covers the bottom surface of the semiconductor wafer.

18 Claims, 2 Drawing Sheets

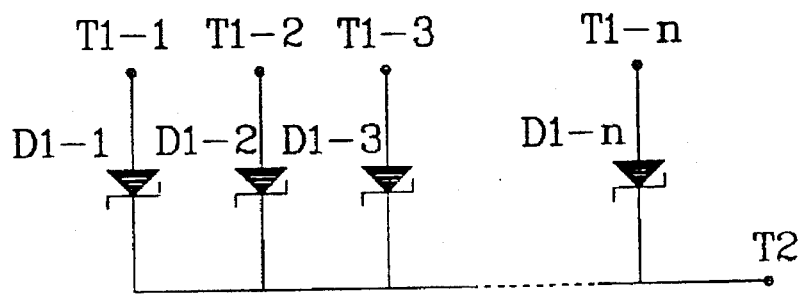
(PRIOR ART) Fig 1A
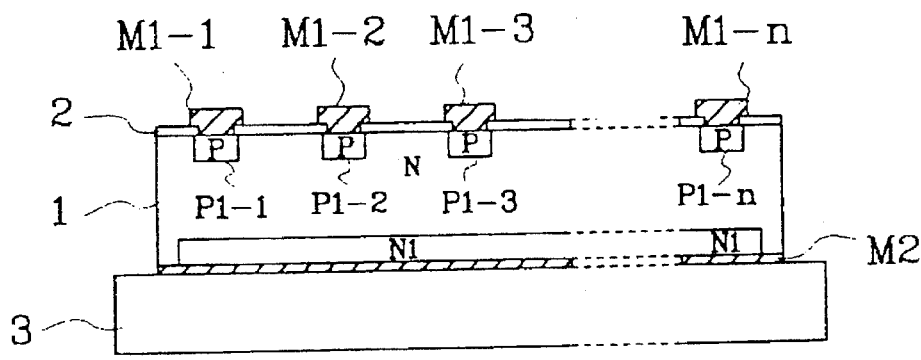
(PRIOR ART) Fig 1B
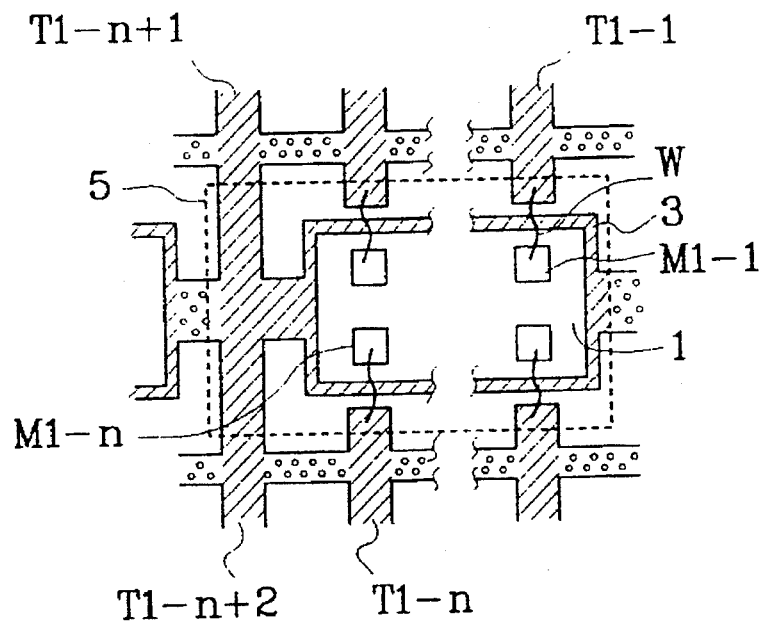
(PRIOR ART) Fig 1C

METHOD OF MAKING A MONOLITHIC DIODE ARRAY

This application is a division of application Ser. No. 08/216,585, filed Mar. 22, 1994, entitled MONOLITHIC DIODE ARRAY, now pending.

BACKGROUND OF THE INVENTION

1. Field of the Invention

The present invention relates to the fabrication of a protection diode array.

2. Discussion of the Related Art

In many practical configurations, it is necessary to fabricate protection diode arrays such as the one illustrated in FIG. 1A in which diodes D1-1, D1-2, D1-3, ... D1-n have first terminals T1-1, T1-2, T1-3, ... T1-n, that are respectively connected to lines to be protected, and a second common terminal T2 connected to a reference voltage such as ground or another line. In the illustrated example and in the following description, all the diodes have a common cathode, but it is apparent that a symmetric array, in which the anodes are common and the cathodes are individually connected to lines to be protected, can be similarly fabricated.

The most conventional way to fabricate, in the form of a monolithic component, a diode array such as the one of FIG. 1A is illustrated in the cross-sectional view of FIG. 1B. The array is realized in the form of a monolithic semiconductor component in an N-type substrate 1. P-type regions P1-1, P1-2, P1-3, ... P1-n are formed at the surface of substrate 1. A highly doped N-type region, N1, is formed on the lower surface of substrate 1. The upper surface of the component is coated with an insulation layer, conventionally a silicon oxide layer 2; metallizations M1-1, M1-2, M1-3, ... M1-n contact each region P1-1 to P1-n. A metallization M2 is formed over the rear surface and contacts region N1. Each metallization M1-1 to M1-n constitutes the anode of one of diodes D1 to Dn; the rear surface metallization M2 constitutes the common cathode of all these diodes. Conventionally, the component is mounted, for example by welding, on a metallic base 3.

Conventionally, as schematically represented by the top view of FIG. 1C, the metallic base 3 on which component 1 is mounted, is part of a lead frame. The lead frame is a metallic plate that is suitably cut off to include base 3, strips T1-1 to T1-n+2 forming pins (indicated by hatched areas in FIG. 1C) and linking elements (indicated by circles in FIG. 1C) that are merely intended to mechanically maintain the frame during the connection phase. The connection phase includes connecting by means of a wire W, usually a gold thread, each metallization region M1-1 to M1-n of the chip at one end of a strip forming the pin T1 to T1-n. The last two pins T1-n+1 and T1-n+2 are extensions of base 3. Indeed, the machines for welding a thread between two points (a pin and a metallization) are very sophisticated and precise, and it is very difficult to adjust these machines to make them perform determined welding operations between points having a determined difference in level (such as a pin and the upper surface of a chip) and points having a dissimilar difference in level or a same level (such as a pin and the base).

Once a chip is welded to the base of a lead frame and its metallization regions are connected by gold threads to elements forming the pins of the frame, the chip is embedded in plastic, for example according to the pattern indicated by the dashed line 5 of FIG. 1C; then the linking elements between the pins of the lead frame (regions indicated by circles in FIG. 1C) are cut away and removed. FIG. 1C is a schematic and is only useful for illustrating the problem that the invention aims at solving. In practice, the casing used can be a casing including two rows of pins, such as a casing S020.

For reasons that clearly appear referring to the top view of FIG. 1C, the cathode contact that corresponds to base 3 is practically unavoidably connected to outermost pins, for example pin T1-n+2 and the facing pin. These cathode terminals (a single terminal could be sufficient, but two are generally provided) are often connected to ground and, for practical reasons, the user may desire that these ground terminals be disposed close to specific pins, for example, the third pin on one side and the seventh pin on the other side, and not close to the outermost pins (pins 10 and 20 or 1 and 11 in the case of a casing including ten pins on each side). Such a mounting is very difficult with the structure of FIG. 1C.

Additionally, the technique for manufacturing semiconductor components has evolved over time. Whereas the various implantation and diffusions steps in a semiconductor chip are theoretically the most complex operations and the ones that impart its function to the component, the combination of these steps (usually referred to in the technique as "front end" operations) are now frequently less expensive than the steps required for the mounting of the chip in a casing (commonly referred to in the technique as "back end" operations). It is now frequently more advantageous to increase the complexity of the diffusion pattern in the silicon in order to simplify mounting, thus reducing the overall cost of the component.

SUMMARY OF THE INVENTION

Thus, an object of the invention is to provide a monolithic component constituting a diode array that easily lends itself to mounting operations in which the common terminal(s) can be simply associated with any pin of a casing.

Another object of the invention is to provide such a component in which the series resistance of the diodes is minimized.

To achieve these objects, the invention provides a semiconductor component constituting an array of protection diodes that are vertically disposed in a semiconductor wafer. A first electrode of the array of diodes is disposed along at least one row on a first surface of the wafer. The component further includes on its first surface a contact region that extends substantially along a length of the row and which is substantially at a potential of a second electrode of the array of diodes, the second electrode corresponding to the rear surface of the component.

In other words, the invention provides a semiconductor component formed in a semiconductor wafer, of a first conductivity type, including a plurality of first regions, of a second conductivity type, formed in a top surface of the wafer and coated with a first metallization; a second region, of the second conductivity type, and a third region, of the first conductivity type, formed in the top surface of the wafer; a second metallization coating the second and third regions; a fourth region, of the first conductivity type, formed in a bottom surface and substantially facing the first and second regions; a fifth region, of the second conductivity type, formed in the bottom surface and substantially facing the third region; and a rear surface metallization.

According to an embodiment of the invention, the plurality of first regions extend along at least one row along a side of the top surface and the second and third regions extend at least along lines that are substantially parallel with the first row.

The foregoing and other objects, features, aspects and advantages of the invention will become apparent from the following detailed description of the present invention when taken in conjunction with the accompanying drawings.

BRIEF DESCRIPTION OF THE DRAWINGS

FIG. 1A is a diagram of an array of protection diodes having a common cathode;

FIG. 1B is a cross-sectional view illustrating a conventional monolithic implementation of the diode array of FIG. 1A;

FIG. 1C is a top view of the conventional component of FIG. 1B associated with a lead frame;

DETAILED DESCRIPTION

As conventional in integrated circuit representation, it will be noted that the various drawings are not drawn to scale, and in particular, in the cross-sectional views, the thicknesses of the various layers are arbitrarily drawn in order to facilitate the legibility of the drawings.

Figure 2A:
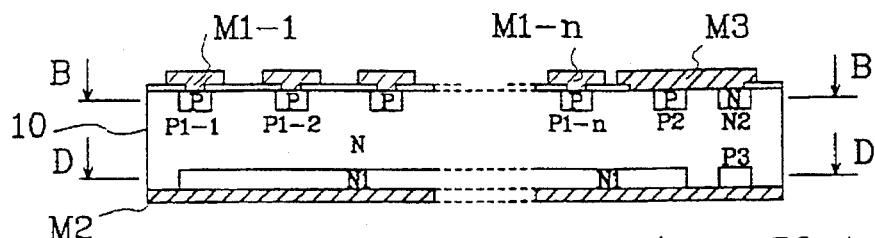
FIG. 2A is a cross-sectional view drawn along line A—A of FIG. 2B of a monolithic implementation of a diode array according to the invention.

As shown in the cross-sectional view of FIG. 2A, a component according to the invention is fabricated by using a low doped N-type semiconductor substrate 10, usually silicon. P-type diffused regions, P1-1 to P1-n, are formed in the upper surface of substrate 10. The doping levels of regions P1-1 to P1-n and of substrate 10 are selected to obtain avalanche diodes having a predetermined breakdown voltage. Below each region P1-1 to P1-n there is formed, from the lower surface of substrate 10, a highly doped N-type region N1. Regions P1-1 to P1-n are associated with metallizations M1-1 to M1-n; and the lower surface of substrate 10 is associated with a metallization M2.

Such as described above, the component according to the invention is identical to the prior art component illustrated in FIG. 1B. The component according to the invention differentiates from the prior art component by the provision of additional layers and the configuration thereof.

More particularly, the upper surface of substrate 10 includes an additional P-type region, P2, and an additional N-type region, N2. Regions P2 and N2 are associated with a metallization M3. Region P2 extends in front of a portion of region N1, and region N2 extends in front of a P-type region P3, formed in the lower surface of the substrate. Metallization M2 also coats this portion of region N1 and region P3.

Three paths connect the silicon metallization M2 to metallization M3. A first path extends from region N1 to region P2, and constitutes a diode having its cathode connected to metallization M2 and its anode connected to metallization M3. The diode is labeled D2 in the equivalent drawing of FIG. 3. A second path extends from region P3 to region N2, and constitutes a diode having its anode connected to metallization M2 and its cathode connected to metallization M3. This diode is labeled D3 in the equivalent drawing of FIG. 3. A third path is formed by a resistor R corresponding to the thickness of the substrate (minus the thickness of layer N2). Hence, regardless of the way the component according to the invention is connected including the polarity of its connections, metallizations M2 and M3 are at potentials that differ only by the voltage drop of a forward bias connected diode (diode D2 or D3). This is apparent from the circuit diagram of FIG. 3.

Figure 3:
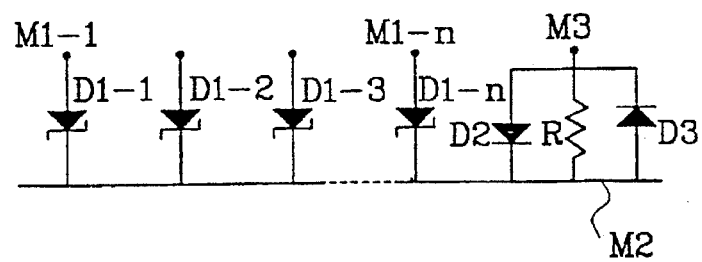
FIG. 3 is an equivalent diagram of a component according to the invention.

Thus, the structure represented in FIG. 2A and the equivalent diagram of FIG. 3 provide, between either one of metallizations (i being an integer comprised between 1 and n) and metallization M3, a protection diode D1-i in series with a forward biased diode. All the metallizations to be connected are on the upper surface of a semiconductor chip; the lower surface of the chip is not connected. Then, a lead frame can be more easily connected to metallizations M1-1 to M1-n and to metallization M3, since all these metallizations are disposed at the same level on a same surface of a component.

Figure 2B:
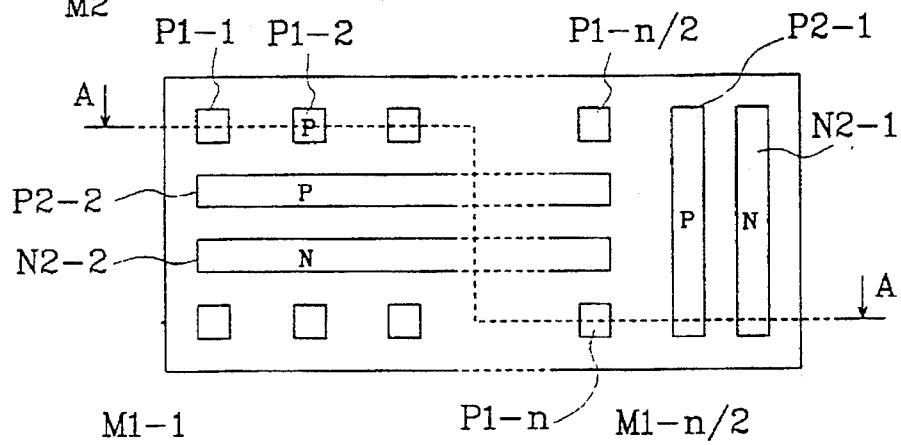
FIG. 2B is a top view drawn along plane B—B of FIG. 2A of a component according to the invention.
Figure 2C:
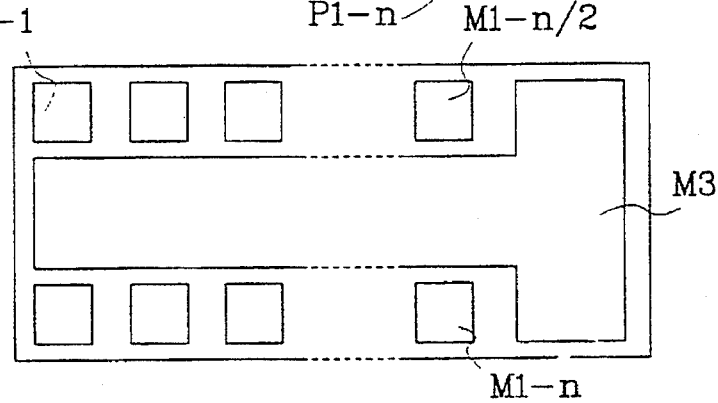
FIG. 2C is a top view of the component of FIG. 2A provided with its metallizations.
Figure 2D:
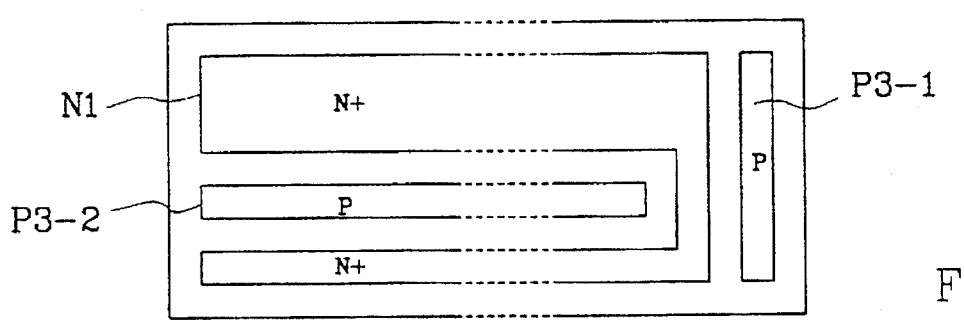
FIG. 2D is a top view of the component of FIG. 2A drawn along plane D—D.

According to another aspect of the invention that appears in the top views of FIGS. 2B–2D, metallization M3 extends over the whole length of the upper surface of the chip, for example in the center of the chip if the upper metallizations M1-1 to M1-n of the individual diodes are disposed along the periphery of the chip.

FIG. 2B is a top view from plane B—B of FIG. 2A, that is, a top view of the component without its metallizations. In this embodiment, regions P1-1 to P1-n are disposed along two parallel lines at the periphery of the component, substantially as shown. Then, diffusion P2 is partitioned into two regions, that may be continuous, one of which, P2-1, extends in the right-hand portion of the drawing, the other, P2-2, extends between the two lines of regions P1-1 to P1-n. Similarly, diffusion N2 is partitioned into two regions, one of which, N2-1, is disposed between the lines of regions P1-1 to P1-n, the other, N2-2, extends on the right-hand portion of the drawing.

As is apparent to those skilled in the art, various modifications can be made to the above disclosed embodiment, more particularly, regions P2-1 and N2-1 can be eliminated to leave in place regions P2-2 and N2-2 only.

FIG. 2C is a top view corresponding to the cross-sectional view of FIG. 2A in which metallizations only are shown. In FIG. 2C, metallization M3 extends between the two metallization lines M1-1 to M1-n and on the right-hand side of the figure. The right-hand extension is optional. Also, an additional optional metallization can be provided on the left-hand side with corresponding regions that are symmetric with respect to regions P2-1 and N2-1.

FIG. 2D is a bottom view along plane D—D of FIG. 2A when the semiconductor component is without metallization M2. Region N1 substantially extends beneath the whole regions P1 and P2 of the upper surface, and region P3 extends below regions N2 of the upper surface. Thus, there is a region P3-1 below region N2-1 and a region P3-2 below region N2-2.

This arrangement of the additional layers P2, N2, and P3, and more particularly of metallization M3, allows for a subsequent easy arrangement in a casing of the component according to the invention because metallization M3 can be connected with any pin without complicating the mounting phase. Thus, referring to the casing structure of FIG. 1C, any pin of the casing can be merely connected through a thread to the central metallization M3, and it will be possible, using a same chip and a same lead frame structure, to simply interchange the pins that are connected to the common metallization M3, to meet the customer's specific requirements. More specifically, the first electrode of each of the plurality of protection diodes is connected, by means of a bond wire, to one of a plurality of bonding strips. In addition, the contact region is also connected to one of the plurality of bonding strips. Further, each of the plurality of bonding strips is connected to one of a plurality of pins of the casing.

By way of example, the invention has been implemented in a chip including 18 protection diodes in a casing S020. The chip's size was 1.5×3 mm, for a 0.35-mm width. The diodes had a 10-volt breakdown voltage. All of the conductivity types were inverted with respect to the above description. Substrate 10 was P-type with a doping level of $10^{17}$ atoms/cm$^3$. The surface concentrations of layers P1, P2, N2 and P3 (N-type, N-type, P-type, and N-type, respectively) were all within the range of $10^{20}$ atoms/cm$^3$.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for forming and mounting a semiconductor component in a casing, comprising the steps of:

vertically forming a plurality of protection diodes in a semiconductor wafer of a first conductivity type, each of the plurality of protection diodes having a first region of a second conductivity type formed at a top surface of the semiconductor wafer and covered by a first metallization and a second region of the first conductivity type formed at a bottom surface of the semiconductor wafer and connected to a second metallization;

forming a third metallization at the top surface of the semiconductor wafer that is electrically coupled to the second metallization of each of the plurality of protection diodes;

connecting, by means of a respective bond wire, the first metallization of said each of the plurality of protection diodes and the third metallization to a respective one of a plurality of bonding strips; and connecting each bonding strip to one pin of a plurality of pins of the casing.

2. The method as claimed in claim 1, wherein the first region of the plurality of protection diodes is an anode region and the second region of the plurality of protection diodes is a cathode region; and further comprising the step of forming a second diode in parallel with the plurality of protection diodes, the second diode having an anode region disposed in the top surface of the semiconductor wafer that is connected to the third metallization and a cathode region disposed in the bottom surface of the semiconductor wafer that is connected to the second metallization.

3. A method for forming and mounting a semiconductor component in a casing, comprising the steps of:

vertically forming a plurality of protection diodes in a semiconductor wafer of a first conductivity type, each of the plurality of protection diodes having an anode region of a second conductivity type formed at a top surface of the semiconductor wafer and covered by a first metallization and a cathode region of the first conductivity type formed at a bottom surface of the semiconductor wafer and connected to a second metallization;

forming a second diode in parallel with the plurality of protection diodes, the second diode having an anode region disposed in the top surface of the semiconductor wafer and a cathode region disposed in the bottom surface of the semiconductor wafer that is connected to the second metallization;

forming a third diode in parallel with the plurality of protection diodes and the second diode, the third diode having an anode region disposed in the bottom surface of the semiconductor wafer and a cathode region disposed in the top surface of the semiconductor wafer;

forming a third metallization at the top surface of the semiconductor wafer that is electrically coupled to the second metallization of each of the plurality of protection diodes and that is physically connected to the anode region of the second diode;

connecting by means of a respective bond wire, the first metallization of each of the plurality of protection diodes and the third metallization to a respective one of a plurality of bonding strips; and connecting each bonding strip to one pin of a plurality of pins of the casing.

4. The method as claimed in claim 3, further comprising the step of connecting the anode region of the second diode and the cathode region of the third diode with the third metallization.

5. A method for forming and mounting a semiconductor component in a casing, comprising the steps of:

vertically forming a plurality of protection diodes in a semiconductor wafer of a first conductivity type, each of the plurality of protection diodes having a first region of a second conductivity type formed at a top surface of the semiconductor wafer and connected to a first metallization, and a fourth region of the first conductivity type formed at a bottom surface of the semiconductor wafer and connected to a second metallization;

forming a third metallization at the top surface of the semiconductor wafer that is electrically coupled to the second metallization of each of the plurality of protection diodes;

forming a second region of the second conductivity type at the top surface of the semiconductor wafer;

forming a third region of the first conductivity type at the top surface of the semiconductor wafer;

forming the fourth region of the first conductivity type at the bottom surface of the semiconductor wafer so as to substantially face the first and second regions;

forming a fifth region of the second conductivity type at the bottom surface of the semiconductor wafer, substantially facing the third region;

coating the second and third regions with the third metallization;

connecting by means of a respective bond wire the first metallization of each of the plurality of protection diodes and the third metallization to a respective one of a plurality of bonding strips; and connecting each bonding strip to one pin of a plurality of pins of the casing.

6. The method as claimed in claim 5, wherein the step of forming the plurality of first regions includes disposing the plurality of first regions along at least one row along a side of the top surface of the semiconductor wafer; and wherein the step of forming the second region and the step of forming the third region include disposing the second region and the third region along lines that are substantially parallel with the at least one row of the plurality of first regions.

7. The method as claimed in claim 6, wherein the steps of forming the second and third regions include disposing the second region and the third region along a partial length of the top surface of the semiconductor component.

8. The method as claimed in claim 7, wherein the step of coating the second and third regions includes coating the second and third regions along the partial length of the semiconductor component such that the third metallization is disposed along the partial length of the semiconductor component.

9. The method as claimed in claim 8, wherein the steps of forming the second region and the third region include disposing the second region and the third region in the center of the top surface of the semiconductor component.

10. The method as claimed in claim 9, wherein the step of forming the plurality of protection diodes includes disposing the plurality of first regions along two parallel rows at the first and at a second side of the top surface of the semiconductor component, such that the second and third regions are disposed between the two parallel rows.

11. The method as claimed in claim 7, wherein the step of forming the second region includes forming a sixth region disposed along the top surface of the semiconductor component in a direction orthogonal to the second region.

12. The method as claimed in claim 11, wherein the step of forming the sixth region includes disposing the sixth region along a side of the top surface of the semiconductor component.

13. The method as claimed in claim 12, wherein the step of coating the second region with the third metallization includes coating the second region and the sixth region so that the third metallization extends along the middle and along the side of the top surface of the semiconductor component.

14. The method as claimed in claim 12, wherein the step of forming the fourth region includes disposing the fourth region along the bottom surface of the semiconductor wafer substantially opposing the first region and the second region along the top surface of the semiconductor wafer.

15. The method as claimed in claim 7, wherein the step of forming the third region includes forming a seventh region at the top surface of the semiconductor wafer disposed in a direction orthogonal to the third region.

16. The method as claimed in claim 15, wherein the step of forming the seventh region includes disposing the seventh region along a side of the top surface of the semiconductor wafer.

17. The method as claimed in claim 16, wherein the step of coating the third region includes coating the third region and the seventh region with the third metallization so that the third metallization extends along the middle and the side of the top surface of the semiconductor component.

18. The method as claimed in claim 16, wherein the step of forming the fifth region includes forming two sections, a first section extending along a middle of the bottom surface of the semiconductor wafer substantially opposing the third region at the top surface of the semiconductor wafer, and a second section along a side of the bottom surface of the semiconductor wafer orthogonal to the first section and substantially opposing the seventh region along the side of the top surface of the semiconductor wafer.

* * * * *